United States Patent [19]

Schlachet

[11] Patent Number: 5,315,534
[45] Date of Patent: May 24, 1994

[54] COMPUTER PROCESS FOR INTERCONNECTING LOGIC CIRCUITS UTILIZING SOFTWIRE STATEMENTS

[75] Inventor: Eli S. Schlachet, San Diego, Calif.

[73] Assignee: Unisys Corporation, Blue Bell, Pa.

[21] Appl. No.: 720,356

[22] Filed: Jun. 25, 1991

[51] Int. Cl.⁵ .............................................. G06F 15/60
[52] U.S. Cl. .................................... 364/490; 364/489; 364/488
[58] Field of Search ................. 364/488, 489, 490, 491

[56] References Cited

U.S. PATENT DOCUMENTS

| | | | |
|---|---|---|---|
| 4,752,887 | 6/1988 | Kuwahara | 364/491 |
| 4,805,113 | 2/1989 | Ishii et al. | 364/491 |
| 4,975,854 | 12/1990 | Yabe | 364/491 |
| 5,005,136 | 4/1991 | Van Berkel et al. | 364/490 |
| 5,038,294 | 8/1991 | Arakawa et al. | 364/491 |
| 5,097,422 | 3/1992 | Corbin, II et al. | 364/491 |
| 5,144,563 | 9/1992 | Date et al. | 364/491 |
| 5,164,908 | 11/1992 | Igarashi | 364/491 |

OTHER PUBLICATIONS

"Programming Language Makes Silicon Compilation a Tailored Affair" by M. R. Burich, Electronic Design, Dec. 12, 1985, pp. 135–142.
"Theory and Concepts of Circuit Layout" by T. C. Hu et al., IEEE, 1985, pp. 3–18.
"A Block Interconnection Algorithm for Hierarchical Layout System" by Fukui et al., IEEE Trans. on C.A.D., vol. CAD-6, No. 3, May 1987, pp. 383–390.
"Compaction Based Custom LSI Layout Design Method" by Ishikawa et al., ICCAD-85, Nov. 18–Nov. 21, 1985, pp. 343–345.

Primary Examiner—Vincent N. Trans
Attorney, Agent, or Firm—Charles J. Fassbender; Mark T. Starr

[57] ABSTRACT

A computer process interconnects logic circuit on an integrated circuit substrate by generating a single softwire statement for each interconnection, and by thereafter utilizing the softwire statements to generate multiple physical layouts for each interconnection. A "softwire statement" is a computer-generated statement which specifies and establishes a route for an interconnection from one terminal of a logic circuit to another terminal as a series of conductive segments which extend in certain directions between relative jog points that are referenced to blockages such as the logic circuits, on the substrate.

12 Claims, 7 Drawing Sheets

```
         START FROM 'SOURCE'
         SET WIRE WIDTH TO IW
S1 → GO UP TO y-COORDINATE OF JP2='A's BR-CIS
S2 → GO RIGHT TO x-COORDINATE OF JP2='A's BR+CIS
S3 → GO UP TO y-COORDINATE OF JP4='FOO's 2BR-IIS
S4 → GO RIGHT TO x-COORDINATE OF JP4='FOO's 2BR+IIS
S5 → GO UP TO 'TARGET's y-COORDINATE
S6 → GO RIGHT TO 'TARGET's x-COORDINATE
```

FIG. 8A

VERT P

CLASS#1  BR

SET WIDTH TO IV
FROM s1
UP TO y-COORDINATE OF B1br-CIS
RIGHT TO x-COORDINATE OF B1br+CIS
UP TO y-COORDINATE OF B2br-CIS
RIGHT TO x-COORDINATE OF B2br+CIS
UP TO d1

CLASS#2  TR

SET WIDTH TO IV
FROM s2
DOWN TO y-COORDINATE OF B3tr+CIS
RIGHT TO x-COORDINATE OF B3tr+CIS
DOWN TO y-COORDINATE OF B4tr+CIS
RIGHT TO x-COORDINATE OF B4tr+CIS
DOWN TO d2

HOR P

CLASS#5  TL

SET WIDTH TO IV
FROM s5
RIGHT TO x-COORDINATE OF B10tl-CIS
UP TO y-COORDINATE OF B10tl+CIS
RIGHT TO x-COORDINATE OF B9tl-CIS
UP TO y-COORDINATE OF B9tl+CIS
RIGHT TO d5

CLASS#6  BL

SET WIDTH TO IV
FROM s6
RIGHT TO x-COORDINATE OF B11bl-CIS
DOWN TO y-COORDINATE OF B11bl-CIS
RIGHT TO x-COORDINATE OF B12bl-CIS
DOWN TO y-COORDINATE OF B12bl-CIS
RIGHT TO d6

```
SET WIDTH TO IW              SET WIDTH TO IW
FROM s3                      FROM s7
DOWN TO y-COORDINATE OF B5tl+CIS    LEFT TO x-COORINATE OF B13br+CIS
LEFT TO x-COORDINATE OF B5tl-CIS    DOWN TO y-COORINATE OF B13br-CIS
DOWN TO y-COORDINATE OF B6tl+CIS    LEFT TO x-COORINATE OF B14br+CIS
LEFT TO x-COORDINATE OF B6tl-CIS    DOWN TO y-COORINATE OF B14br-CIS
DOWN TO d3                   LEFT TO d7
         CLASS#3    TL                CLASS#7   BR

SET WIDTH TO IW              SET WIDTH TO IW
FROM s4                      FROM s8
UP TO y-COORDINATE OF B8bl-CIS    LEFT TO x-COORINATE OF B16tr+CIS
LEFT TO x-COORDINATE OF B8bl-CIS    UP TO y-COORINATE OF B16tr+CIS
UP TO y-COORDINATE OF B7bl-CIS    LEFT TO x-COORINATE OF B15tr+CIS
LEFT TO x-COORDINATE OF B7bl-CIS    UP TO y-COORINATE OF B15tr+CIS
UP TO d4                     LEFT TO d8
         CLASS#4    BL                CLASS#8   TR
```

FIG.8B

| FIG.8A |
| FIG.8B |

FIG.8

COMPUTER PROCESS FOR INTERCONNECTING LOGIC CIRCUITS UTILIZING SOFTWIRE STATEMENTS

BACKGROUND OF THE INVENTION

This invention relates to Computer Aided Design (CAD) systems; and more particularly, it relates to CAD software programs which lay out physical interconnections for logic circuits on an integrated circuit substrate.

As one example, the above logic circuits can be a variety of logic cells and the above substrate can be a single semiconductor chip. As another example, the logic circuits can be several integrated circuit chips and the substrate can be a multichip ceramic wafer. In a typical CAD system, a library of many different types of logic circuits is provided; and from that library, certain logic circuits are selected for placement on each particular substrate. Usually, a logic cell library contains over one hundred different types of cells such as various types of NAND gates, NOR gates, AND gates, OR gates, multiplexers, latches, flip-flops, etc.; and several thousand of such cells are usually placed on a single semiconductor chip.

Each logic circuit has one or more input terminals and one or more output terminals; and, those terminals need to be selectively interconnected on the substrate. A listing of which terminals are to be connected together is provided by a netlist. Given the netlist and the list of circuits that are selected from the library, the problem arises of precisely where on the substrate each of the selected circuits and each of the circuit interconnections should be physically located. As the number of circuits plus the number of interconnections increases, solving the above "layout" problem becomes more and more tedious.

Originally in the prior art, the above layout problem was solved as follows. To begin, a design engineer or technician assigned specific locations on the substrate to each of the logic circuits. This was done by defining a fixed x, y coordinate system on the substrate, and by giving specific x and y dimensional coordinates to each of the circuits. Thereafter, a CAD software program received as an input the x and y dimensional coordinates of each of the circuits along with the netlist; and as an output the CAD program provided specific x and y dimensional coordinates to each of the circuit interconnections. In performing this task, the CAD program performed a global routing step in which certain open channels were found for each interconnection, and it performed a detailed routing step in which specific x, y dimensional coordinates were assigned to each interconnection in its channel.

Later in the prior art, another CAD layout system called a symbolic layout CAD system was developed. With the symbolic layout CAD system, a design engineer or technician graphically locates the logic circuits by electronically arranging various symbols that represent those circuits on CRT screen. Typically, the symbols are moved on the CRT screen by means of an electromechanical "mouse". Also the design engineer/technician uses the mouse to draw lines on the CRT screen from one symbol to another, as a representation of physical conductors between the logic circuits. Then, after the desired arrangement of the symbols and lines is made, another CAD program called a "Compactor" assigns dimensional x and y coordinates to each of the circuits and conductors that correspond to symbols and lines.

A problem however, with both of the above described processes is that they are too inflexible to accommodate certain changes to the physical layout of the cells and their interconnections which inevitably need to be made multiple times during the design and checkout of any new project. For example, such a change is needed to correct each error in the design, and to accommodate each new functional requirement of the design, and to comply with each change in the layout rules. With the above CAD systems, each time the physical layout of the logic circuits on the substrate changes, all of the layout steps for the logic circuit interconnections need to be repeated; and, that costs both time and money.

Accordingly, a primary object of the invention is to provide a novel CAD process in which the logic circuits can be moved on the substrate and the layout of the interconnections can be obtained without repeating all of the layout steps from the scratch.

BRIEF SUMMARY OF THE INVENTION

In accordance with the invention, a computer process is disclosed which interconnects logic circuit on an integrated circuit substrate by generating a single softwire statement for each interconnection, and by thereafter utilizing the softwire statements to generate multiple physical layouts for each interconnection. By a "softwire statement" is herein meant a computer-generated statement which specifies and establishes a route for an interconnection from one terminal of a logic circuit to another terminal as a series of conductive segments which extend in certain directions between relative jog points that are referenced to blockages on the substrate. These blockages include the logic circuits themselves and any pre-existing interconnections. Since the locations of the jog points are not fixed but are referenced to the blockages, the jog points move as the blockages move and the softwire statements of the interconnections remain unchanged. When the logic circuits are moved from one physical location on the substrate to another location to correct an error or accommodate a new functional requirement or to comply with new layout rules, a layout for the physical interconnections between the logic circuits at their new location is obtained by simply substituting into the softwire statements the dimensional coordinates of the blockages to which the jog points in the statements are referenced. Thus, by utilizing softwire statements, the need to reperform the conventional global and detailed routing steps for each physical layout of the interconnections is eliminated.

BRIEF DESCRIPTION OF THE DRAWINGS

Various features and advantages of the invention are described herein in conjunction with the accompanying drawings wherein.

DETAILED DESCRIPTION

Figure 1:
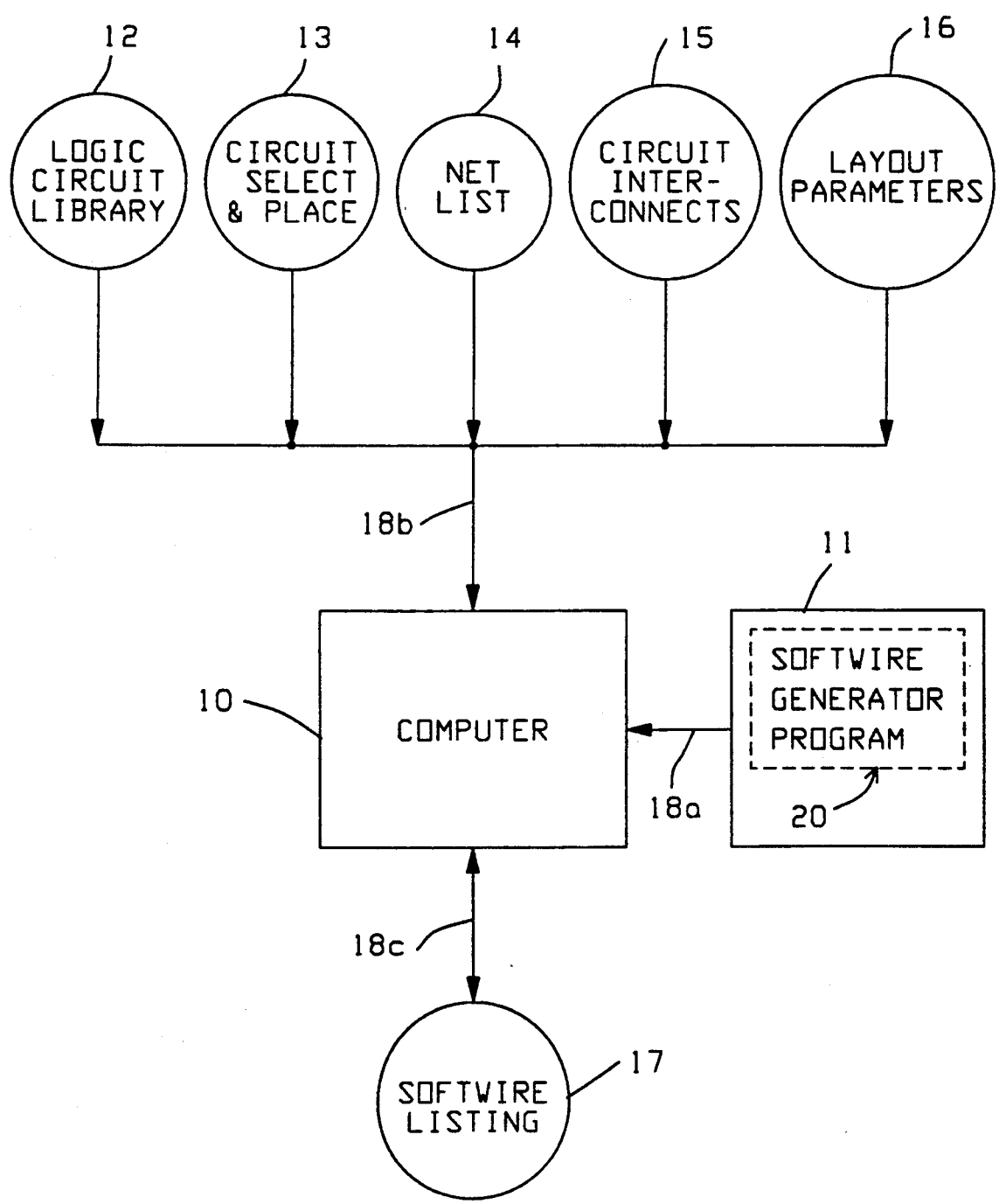
FIG. 1 illustrates a data processing system which performs a CAD layout process in accordance with the invention.

Referring now to FIG. 1, it shows a data processing system which operates to interconnect logic circuits on an integrated circuit substrate in accordance with the invention. This data processing system includes a digital computer 10, an instruction memory 11, several data files 12–16, and an output file 17 in which softwire statements are listed. All of these components are interconnected via buses 18a–18c, as shown.

File 12 is a library of each type of logic circuit that is selectively disposed on the substrate. In one embodiment, the library describes the physical makeup of various logic cells that are integrated into a single semiconductor chip. In another embodiment, the library describes the physical makeup of various semiconductor chips that are mounted on a ceramic multi-chip wafer.

File 13 identifies all of the logic circuits that are selected from the library 12 and placed on the substrate, and it identifies the locations of those circuits on the substrate. File 13 can be generated in any fashion such as by a hand layout or by any pre-existing CAD program. Each logic circuit has certain input/output terminals, and those terminals which are to be interconnected are identified by a netlist file 14. Any pre-existing interconnections for the logic circuits of file 13 are contained in file 15. A set of values for certain layout parameters CIS, IIS, and IW for the softwire interconnections, is contained in file 16. CIS is a minimum logic circuit to interconnection spacing; IIS is a minimum interconnection to interconnection spacing; and, IW is a minimum interconnection line width.

Figure 2:
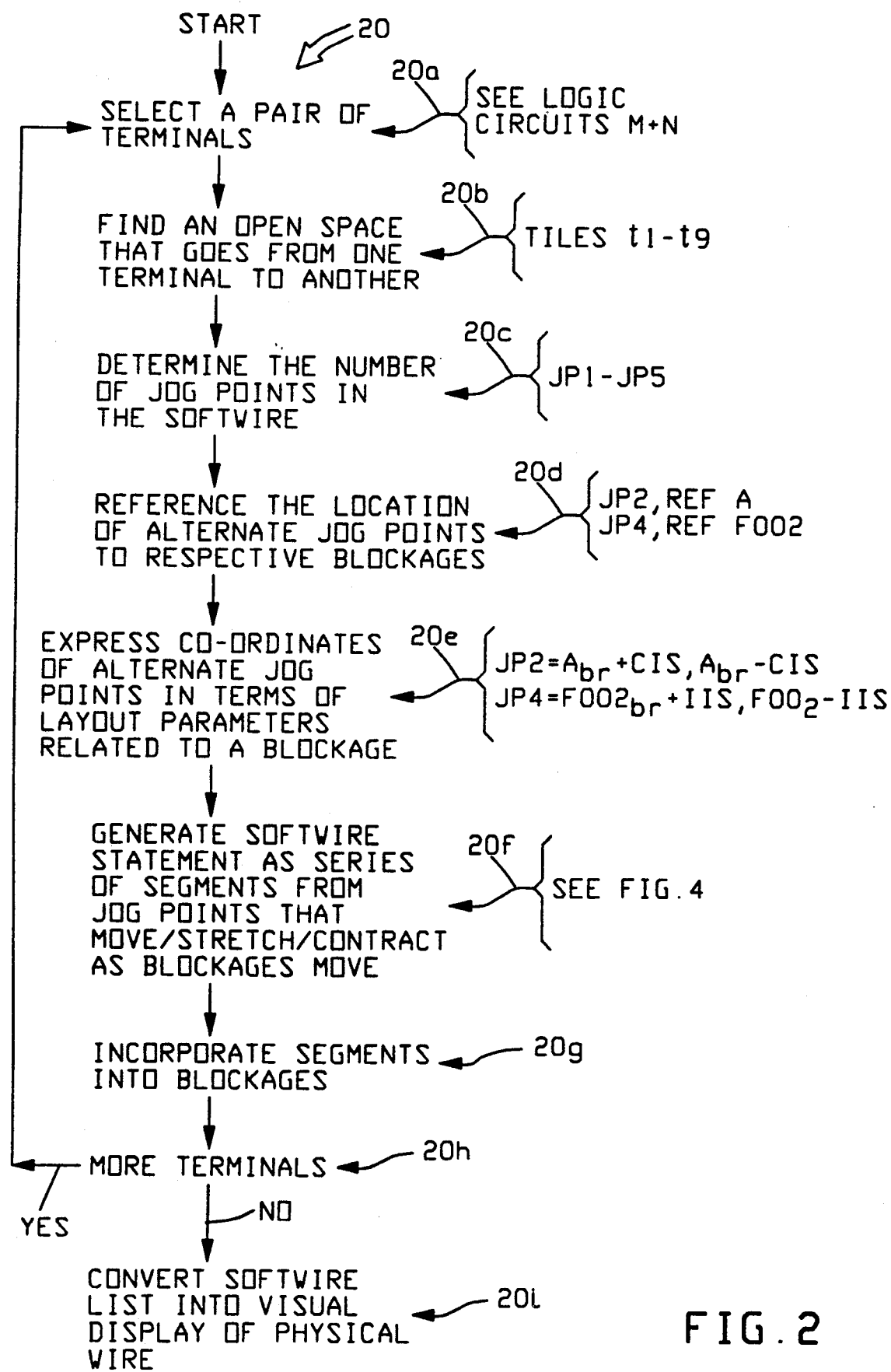
FIG. 2 illustrates the steps of the CAD layout process which the FIG. 1 system performs.

Stored in the instruction memory 11 is a computer program 20 which interconnects the logic circuits on the substrate by directing the computer 10 to receive and process the data in the files 12–16. As one intermediate result of that processing, computer 10 produces a listing of softwire statements in the output file 17. All of the process steps that are performed by computer 10 in response to the program 20 are shown in FIG. 2. Also, specific examples of the FIG. 2 process steps are shown in FIG's. 3 and 4.

Figures 3, 4:
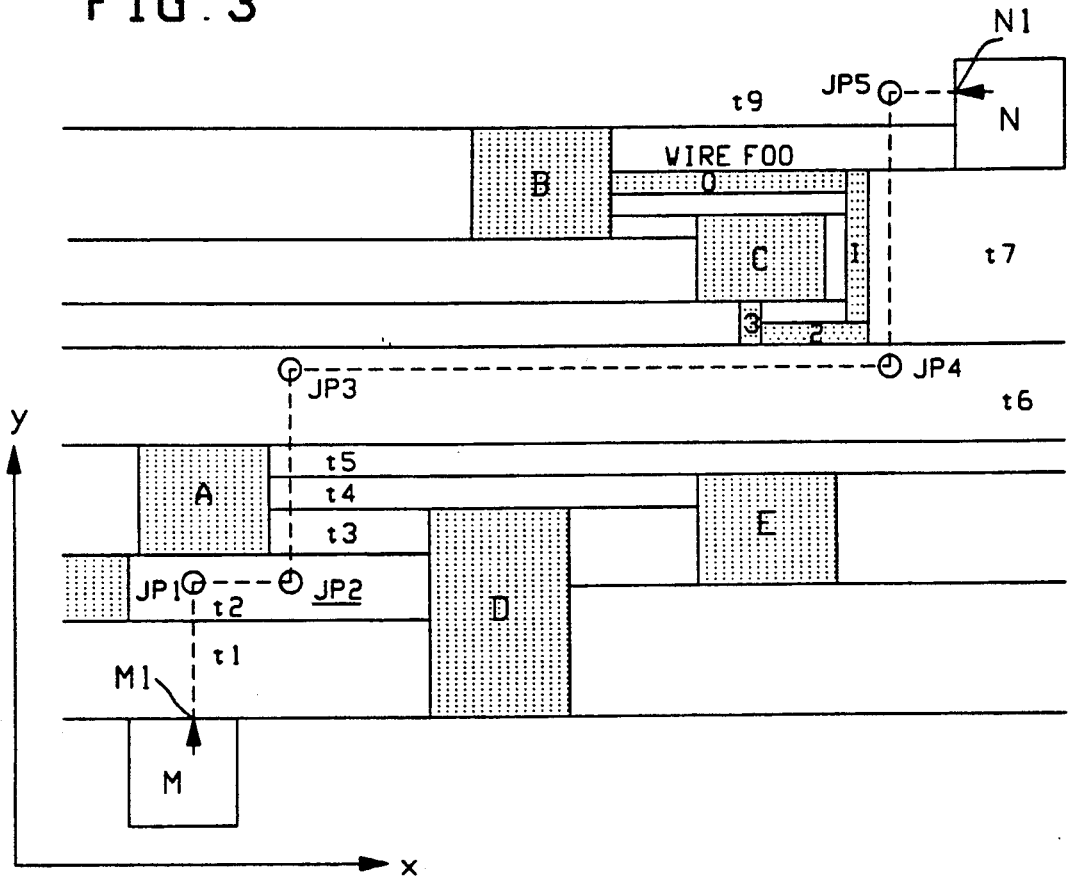
FIG. 3 shows an interconnection that is being formed on a chip in accordance with the process of FIG. 2.
FIG. 4 illustrates a softwire statement that is generated by the process of FIG. 2 and which establishes various layouts for the FIG. 3 interconnection.

As a first step 20a of the process 20, a pair of terminals which are to be interconnected are selected from the netlist 14. An example of this step is shown in FIG. 3 wherein the terminals that are to be interconnected are shown as M1 and N1 on a logic circuits M and N. Next, in step 20b, an open space on the substrate is found which goes from one of the above selected terminals to the other. This open space is the "global" route for the softwire that is to be generated. In the example of FIG. 3, the open space is bordered by several logic circuits A–E and by one pre-existing interconnection that is labelled "FOO". By extending lines in the "x" direction from the corners of those blockages, a set of rectangular tiles t1–t9 are formed which define the open space between the terminals M1 and N1.

Subsequently, in accordance with steps 20c–20f, a set of relative jog points for the interconnection between the selected pair of terminals is established in the open space t1–t9. In step 20c, the total number of jog points to be used is determined; and, in the example of FIG. 3, there are five jog points JP1–JP5. Then, in step 20d, every other jog point is referenced to a respective blockage. In the example of FIG. 3, jog point JP2 is referenced to logic circuit A, and jog point JP4 is referenced to the second segment F002 of wire F00.

Thereafter in step 20e, x and y coordinates of the above alternate jog points are expressed in terms of the layout parameters relative to their respective blockage. Applying this step to the example of FIG. 3, the coordinates of jog point JP2 are $x=A_{br}+CIS$, $y=A_{br}-CIS$; and the coordinates of jog point JP4 are $x=F002_{br}+IIS$, $y=F002_{br}-IIS$. In the above expressions, $A_{br}$ is the bottom right corner of a logic circuit A; $F002_{br}$ is the bottom right corner of the second segment of wire F00; and CIS, IIS, and IW are the previously defined layout parameters.

Next, as is indicated by step 20f, a softwire statement is generated in the output file 17. This statement establishes an interconnection between the selected pair of terminals as a series of conductor segments that extend in the x and y directions from the above expressed coordinates of the alternate jog points. Such a softwire statement for the example of FIG. 3 is given in FIG. 4. There, the interconnection consists of a total of six segments S1–S6.

Each segment of the softwire statement from step 20f constitutes a blockage for any additional terminals that are to be interconnected. This is indicated by step 20g. Each blockage is stored in file 15 as either a physical wire with fixed dimensional coordinates or with relative coordinates. And, for each such pair of terminals, the steps 20a–20g are repeated.

After the list of softwire statements is complete, a particular physical layout for each softwire statement can be visually displayed. This is achieved in the proces 20 by a step 20i. In step 20i, each of the expressions for the jog points in the softwire statement listing is evaluated by substituting the specific dimensional co-ordinates of the blockages from file 13 and the specific dimensional values of the layout parameters from file 16 into the softwire statements. Conductors having the resulting dimensional coordinates are displayed on a CRT screen and/or plotted on paper; and they are added to file 15. Thereafter, an actual integrated circuit having the displayed layout can be fabricated from the dimensional data in files 13 and 15 by any conventional integrated circuit fabrication process.

A primary feature of the FIG. 2 process is that the location of the jog points in the softwire statements are expressed in relative terms with respect to various blockages, rather then in terms of fixed dimensional x, y coordinates. For example, segment #1 is referenced to the bottom right corner of logic circuit A; and segment #3 is referenced to the bottom right corner of blockage F002. Consequently, logic circuit A and/or wire F00 can be moved from one specific location to another; and so long as additional jog points are not introduced into the M1-N1 interconnection, the softwire statement of FIG. 4 remains unchanged. Thus, to obtain dimensional coordinates of the M1-N1 interconnections after such a move, the steps of generating the softwire statement do not need to be repeated. All that needs to be done is to re-evaluate the previously generated FIG. 4 statement.

Another feature of the FIG. 2 process is that the jog points in the softwire list are expressed in terms of layout parameters CIS, IIS, and IW rather then specific dimensional values for those parameters. Consequently, the fabrication process that builds the actual logic circuits and their interconnections can be modified (e.g., upgraded) without changing the softwire statements. Thus, to obtain dimensional coordinates of the interconnections after such a fabrication process upgrade, the previously generated softwire statement need only be re-evaluated.

Figure 5:
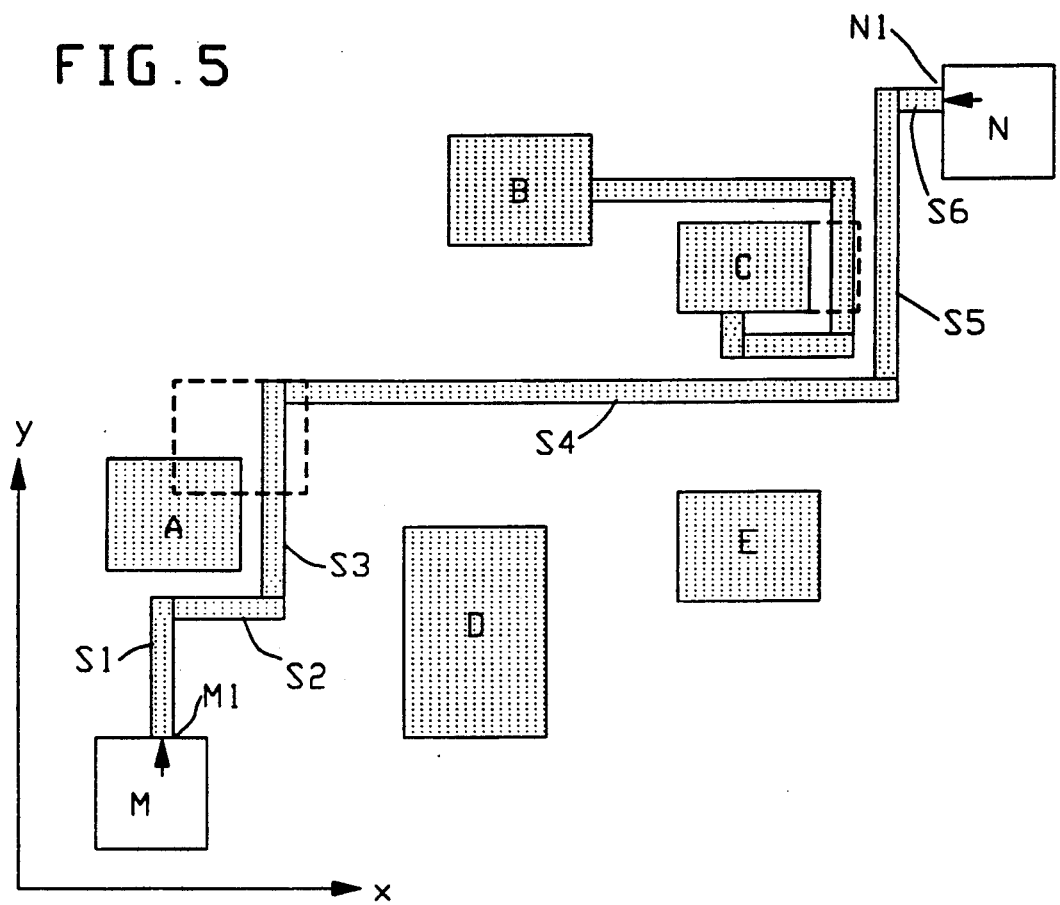
FIGS. 5 and 6 illustrate two different physical layouts that are established by the softwire statement of FIG. 4.
Figure 6:
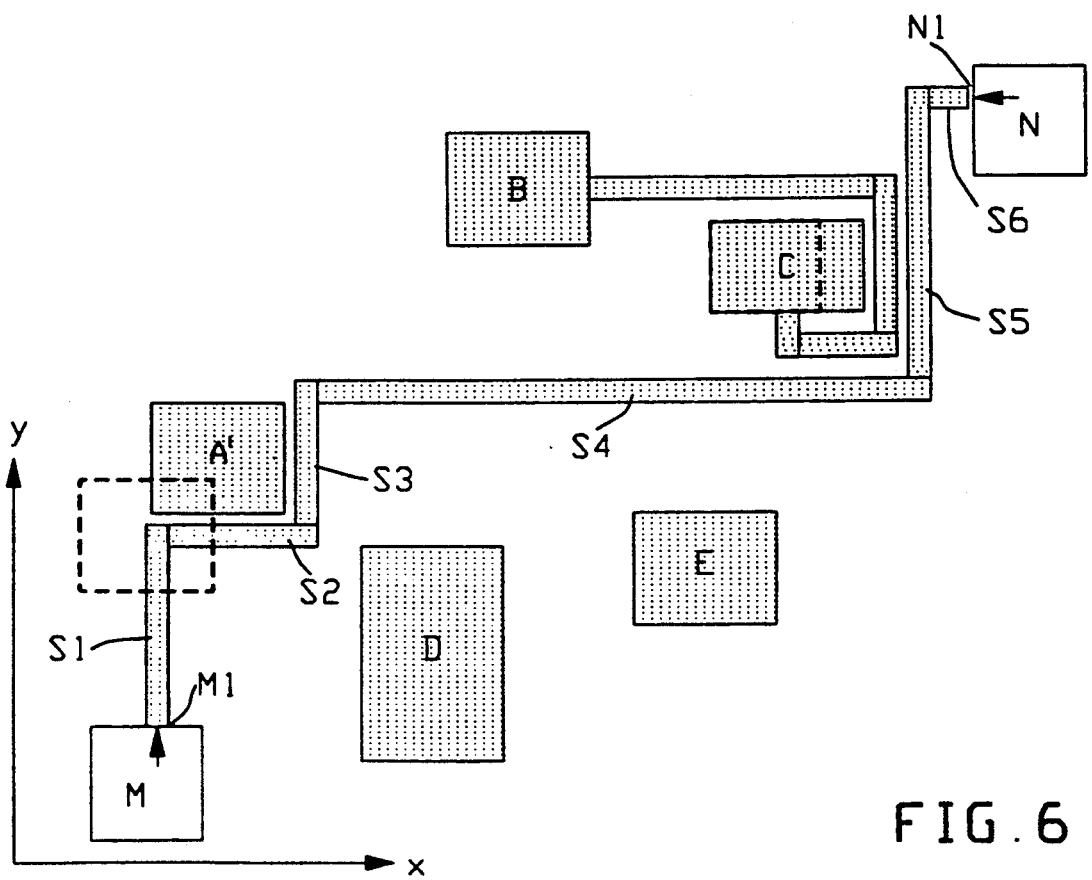

Both of the above described features are illustrated in FIG.'s. 5 and 6. In FIG. 5, one particular physical layout for the M1-N1 interconnection is plotted between the logic circuits A-E and wire F00 in accordance with the softwire statement of FIG. 4. By comparison, FIG. 6 is a modification of the FIG. 5 layout in which logic circuit A is moved to a new location A'; logic circuit C is increased in size as shown by C'; wire F00 is stretched to accommodate the increased size of logic circuit C'; and the magnitude of the layout parameters CIS and IIS are decreased.

Each of the above modifications causes the dimensional coordinates of the M1-N1 interconnection to change. However, the softwire statement of the FIG. 6 interconnection and the softwire statement of the FIG. 5 interconnection are exactly the same. Thus, once the softwire statement of FIG. 4 is generated, one particular layout (such as FIG. 5) can be changed to another particular layout (such as FIG. 6) without spending any computer time and money to find a global route and find a detailed route for the new layout. For an actual integrated circuit, dozens of layout iterations may have to be made. In the prior art, generating all of the various layouts can account for over fifty percent of the total design time; and thus the time and money which the present invention saves can be substantial.

In the above described FIG.'s. 3–6, the M1-N1 interconnection illustrates just one particular class of interconnections (herein called class #1) that can be established by a softwire statement. Other classes of interconnection (herein called classes #2–#8) that can also be established by a softwire statement are illustrated in FIG. 7.

Figure 7:
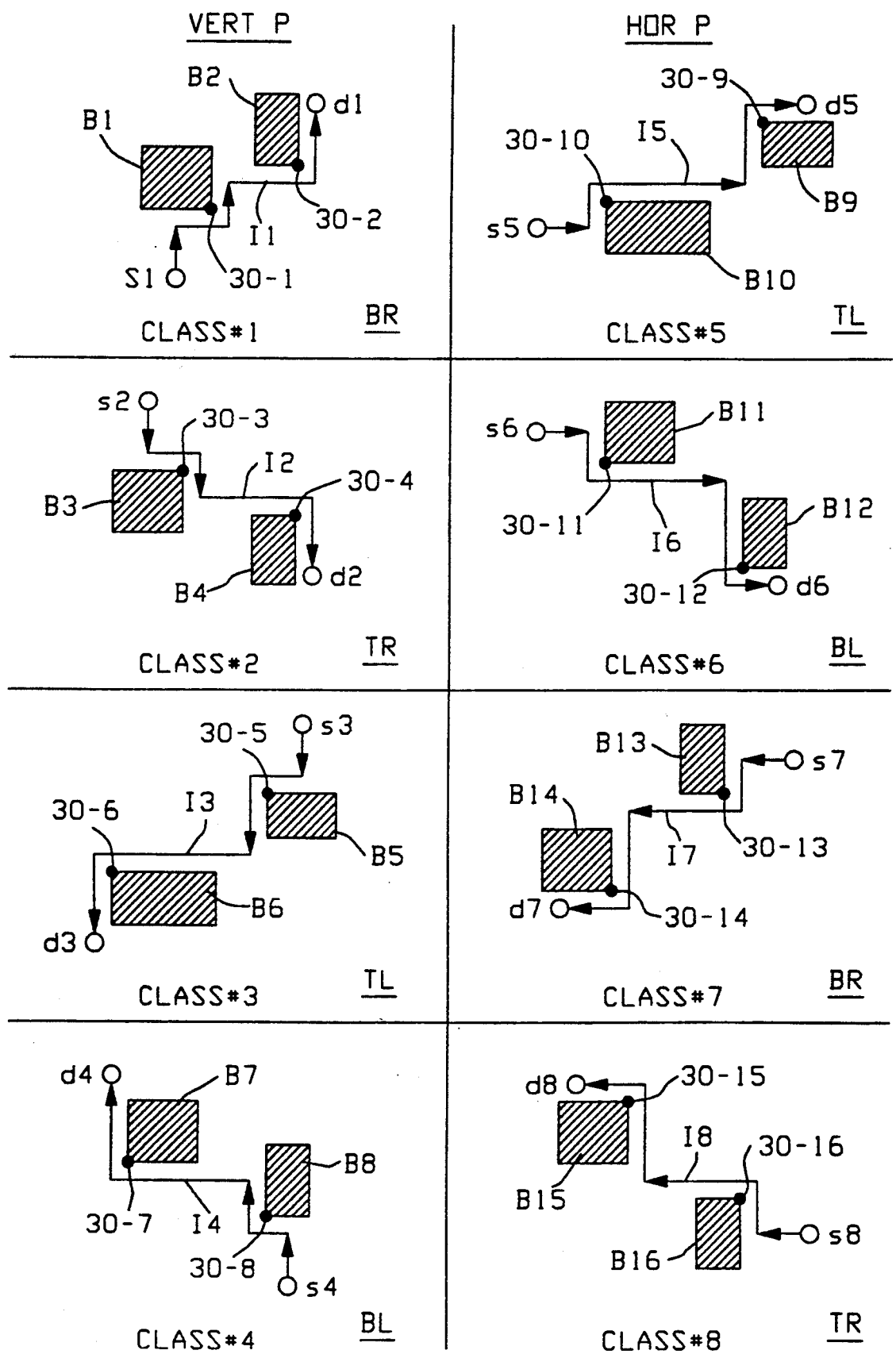
FIG. 7 illustrates several classes of interconnections which may occur on a substrate; and, FIGS. 8A and 8B list respective softwire statements that establish various physical layouts for the interconnection classes of FIG. 7.

In FIG. 7, the interconnections are labelled I1, I2, I3, etc.; blockages for the interconnection are labelled B1, B2, B3, etc.; source terminals for the interconnections are labelled s1, s2, etc.; and destination terminals for the interconnections are labelled d1, d2, etc.

All of the interconnections of classes 1–4 have a "vertically preferred" route from their source to their destination. By a vertically preferred route is meant a route which goes in the y direction rather then the x direction so long as the interconnection can stay within its open space. By comparison, all of the interconnections of classes 5–8 have a "horizontally preferred" route from the source to the destination terminal. By a horizontally preferred route is meant a route which goes in the x direction rather then the y direction so long as the interconnection can stay within its open space.

In classes 1 and 5, the destination terminal is to the right and above the source terminal; in classes 2 and 6, the destination terminal is to the right and below the source terminal; in classes 3 and 7, the destination terminal is to the left and below the source terminal; and in classes 4 and 8, the destination terminal is to the left and above the source terminal.

Also in FIG. 7, reference numerals 30-1 thru 30-16 identify the particular corner of the blockages to which the jog points in the interconnections I1-I8 are referenced. For classes numbered 1 and 7, the jog points are referenced to the bottom right corner of the blockages; for classes 3 and 5, the jog points are referenced to the top left corner of the blockages; for classes number 2 and 8, the jog points are referenced to the top right corner of the blockages; and for classes 4 and 6, the jog points are referenced to the bottom left corner of the blockages.

Utilizing the above jog points, respective softwire statements can be generated which establish the illustrated interconnections I1-I8 as well as a variety of modifications to those interconnections that occur when the blockages B1-B16 are moved. Such softwire statements are listed in FIG. 8.

A computer process for interconnecting logic circuits by means of softwire statements has now been described in detail. In addition however, various changes and modifications can be made to the above described details without departing from the nature and spirit of the invention.

For example, in the process of FIG. 2, the softwire statements can be generated such that the interconnections that they establish include all or just some of the interconnection classes of FIG. 8. In one particular version of the FIG. 2 process, softwire statements are generated such that they establish interconnections which have only a vertically preferred route (classes 1–4). In another version of the FIG. 2 process, softwire statements are generated such that they establish interconnections which have only a horizontally preferred route (classes 5–8).

As another alternative, by referencing the jog points in the softwire statements to just the bottom right and top right corners blockages, the resulting interconnections are limited to classes 1, 2, 7, and 8. Alternatively, by referencing the jog points in the softwire statements to just the bottom left and top left corners of the blockages, the resulting interconnections are limited to classes 3, 4, 5, and 6.

As still another modification, the FIG. 2 process can be changed such that step $20_i$ immediately follows step $20_f$. With this modification, each time a softwire statement is generated, one particular layout of a physical conductor which that softwire statement establishes is displayed on a CRT screen.

Accordingly, it is to be understood that the invention is not limited to the above described details but is defined by the appended claims.

What is claimed is:

1. A computer process for interconnecting logic circuits on an integrated circuit substrate; said process including the steps of:

providing a set of files for said computer which identify—a) blockages, including said logic circuits and pre-existing interconnections on said substrate, b) terminals on said logic circuits that are to be interconnected, and c) a set of layout parameters;

finding, via said computer, an open space on said substrate which goes from one of said terminals to another;

locating, via said computer, relative jog points in said open space with the location of each jog point being established in terms of said layout parameters relative to a respective blockage such that said jog points move as their respective blockage move and/or layout parameters change; and, generating, via said computer, a softwire statement that specifies an interconnection from said one terminal to said another terminal as a series of conductor segments which extend in certain directions from said jog points and which stretch/contract as said blockages and jog points move.

2. A process according to claim 1 and further including the step of visually displaying one particular layout of said conductor segments on said substrate.

3. A process according to claim 2 and further including the steps of moving said blockages and respective jog points on said substrate without changing said softwire statement, and visually displaying another layout of said conductor segments.

4. A process according to claim 1 wherein said locating step includes the substep of limiting the total number of blockages to which said jog points are referenced to be approximately one-half the total number of jog points.

5. A process according to claim 4 wherein said locating step includes the substep of referencing said jog points to just two particular corners in said blockages.

6. A process according to claim 5 wherein said two particular corners are a top right corner and a bottom right corner.

7. A process according to claim 5 wherein said two particular corners are a top left corner and a bottom left corner.

8. A process according to claim 4 and further including the step of visually displaying one particular layout of said conductor segments on said substrate.

9. A process according to claim 8 and further including the step of moving said blockages and respective jog points on said substrate without changing said softwire statement, and visually displaying another layout of said conductor segments.

10. A process according to claim 1 and further including the additional steps of incorporating said conductor segments into said blockages, and generating a list of softwire statement by repeating said finding step through said incorporating step on remaining terminals in said file.

11. A process according to claim 10 and further including the step of visually displaying one particular physical layout of said conductor segments for each softwire statement on said list after said list is generated.

12. A process according to claim 10 and further including the step of visually displaying one particular physical layout of said conductor segments each time a softwire statement is generated.

* * * * *